(12) United States Patent
Manning et al.

(10) Patent No.: US 9,696,910 B2
(45) Date of Patent: *Jul. 4, 2017

(54) DATA COMPRESSION AND MANAGEMENT

(71) Applicant: Micron Technology, Inc., Boise, ID (US)

(72) Inventors: Troy A. Manning, Meridian, ID (US); Troy D. Larsen, Meridian, ID (US); Martin L. Culley, Boise, ID (US); Jeffrey L. Meader, Blackstone, MA (US); Steve G. Bard, Boise, ID (US); Dean C. Eyres, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/867,139

(22) Filed: Sep. 28, 2015

(65) Prior Publication Data

US 2016/0018993 A1 Jan. 21, 2016

Related U.S. Application Data

(63) Continuation of application No. 13/531,090, filed on Jun. 22, 2012, now Pat. No. 9,148,172.

(51) Int. Cl.
*G06F 3/06* (2006.01)
*H03M 7/30* (2006.01)

(52) U.S. Cl.
CPC .......... *G06F 3/0608* (2013.01); *G06F 3/0661* (2013.01); *G06F 3/0673* (2013.01);
(Continued)

(58) Field of Classification Search
CPC ....................................................... H03M 7/30
See application file for complete search history.

(56) References Cited

U.S. PATENT DOCUMENTS 7,194,596 B2 3/2007 Wu et al.
8,013,762 B2 9/2011 Matthews, Jr. et al.
(Continued)

FOREIGN PATENT DOCUMENTS

CN 102318327 1/2012
JP 2011128792 6/2011

OTHER PUBLICATIONS

Notice of Rejection for related Japan Patent Application No. 2015-518612, dated Feb. 23, 2016, 6 pages.
(Continued)

*Primary Examiner* — David X Yi
*Assistant Examiner* — Zubair Ahmed
(74) *Attorney, Agent, or Firm* — Brooks, Cameron & Huebsch, PLLC (57) ABSTRACT

The present disclosure includes apparatuses and methods for data compression and management. A number of methods include receiving a number of data segments corresponding to a managed unit amount of data, determining a respective compressibility of each of the number of data segments, compressing each of the number of data segments in accordance with its respective determined compressibility, forming a compressed managed unit that includes compressed and/or uncompressed data segments corresponding to the number of data segments corresponding to the managed unit amount of data, and forming a page of data that comprises at least the compressed managed unit.

20 Claims, 8 Drawing Sheets

(52) U.S. Cl.
  CPC .............. *H03M 7/30* (2013.01); *H03M 7/60* (2013.01); *H03M 7/6082* (2013.01)

(56) References Cited

U.S. PATENT DOCUMENTS

| | | |
|---|---|---|
| 8,037,255 B2 | 10/2011 | Jeong et al. |
| 8,131,688 B2 | 3/2012 | Papovski et al. |
| 9,235,507 B2 | 1/2016 | Owa et al. |
| 2003/0090397 A1 | 5/2003 | Rasmussen |
| 2003/0112161 A1 | 6/2003 | Malik |
| 2005/0105125 A1 | 5/2005 | Park et al. |
| 2009/0268903 A1 | 10/2009 | Bojinov et al. |
| 2010/0011150 A1 | 1/2010 | Klein |
| 2010/0088464 A1 | 4/2010 | Yang |
| 2011/0093650 A1 | 4/2011 | Kwon et al. |
| 2011/0099321 A1 | 4/2011 | Haines et al. |
| 2011/0252184 A1 | 10/2011 | Cho et al. |
| 2011/0289263 A1 | 11/2011 | McWilliams et al. |
| 2012/0072971 A1 | 3/2012 | Zhang et al. |
| 2012/0102295 A1 | 4/2012 | Yang |

OTHER PUBLICATIONS

Office Action for related Taiwan Patent Application No. 102122429, dated Dec. 21, 2015, 19 pages.
International Search Report and Written Opinion for related PCT Application No. PCT/US2013/047107, mailed Oct. 18, 2013, (11 pages).
Office Action for related China Patent Application No. 201380038327.1, dated Sep. 14, 2016, 37 pages.

DATA COMPRESSION AND MANAGEMENT

PRIORITY INFORMATION

This application is a Continuation of U.S. application Ser. No. 13/531,090, filed Jun. 22, 2012, which issues as U.S. Pat. No. 9,148,172 on Sep. 29, 2015, the contents of which are included herein by reference.

TECHNICAL FIELD

The present disclosure relates generally to semiconductor memory and methods, and more particularly, to apparatuses and methods for data compression and management.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory devices can be combined together to form a storage volume of a memory system such as a solid state drive (SSD). A solid state drive can include non-volatile memory (e.g., NAND flash memory and NOR flash memory), and/or can include volatile memory (e.g., DRAM and SRAM), among various other types of non-volatile and volatile memory.

An SSD can be used to replace hard disk drives as the main storage volume for a computer, as the solid state drive can have advantages over hard drives in terms of performance, size, weight, ruggedness, operating temperature range, and power consumption. For example, SSDs can have superior performance when compared to magnetic disk drives due to their lack of moving parts, which may avoid seek time, latency, and other electro-mechanical delays associated with magnetic disk drives. SSD manufacturers can use non-volatile flash memory to create flash SSDs that may not use an internal battery supply, thus allowing the drive to be more versatile and compact.

An SSD can receive commands from a host in association with memory operations such as read and write operations to transfer data (e.g., between the memory devices and the host). It can be beneficial to increase the throughput associated with an SSD and/or to increase the storage capacity of SSDs, for example.

DETAILED DESCRIPTION

The present disclosure includes apparatuses and methods for data compression and management. A number of methods include receiving a number of data segments corresponding to a managed unit amount of data, determining a respective compressibility of each of the number of data segments, compressing each of the number of data segments in accordance with its respective determined compressibility, forming a compressed managed unit that includes compressed and/or uncompressed data segments corresponding to the number of data segments corresponding to the managed unit amount of data, and forming a page of data that comprises at least the compressed managed unit.

A number of methods include storing a page of data in a memory, wherein the page of data includes metadata indicating a physical organization of a number of compressed managed units within the page of data. Each of the number of compressed managed units corresponds to a managed unit amount of data, the managed unit amount of data corresponding to a number of (N) uncompressed data segments, and each of the compressed managed units begins on one of a number of quantized boundaries of the page, wherein a space allocation between each successive quantized boundary is capable of accommodating an uncompressed data segment.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N", particularly with respect to reference numerals in the drawings, indicates that a number of the particular feature so designated can be included. As used herein, "a number of" a particular thing can refer to one or more of such things (e.g., a number of memory devices can refer to one or more memory devices).

The figures herein follow a numbering convention in which the first digit or digits correspond to the drawing figure number and the remaining digits identify an element or component in the drawing. Similar elements or components between different figures may be identified by the use of similar digits. For example, 230 may reference element "30" in FIG. 2, and a similar element may be referenced as 430 in FIG. 4. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

Figure 1:
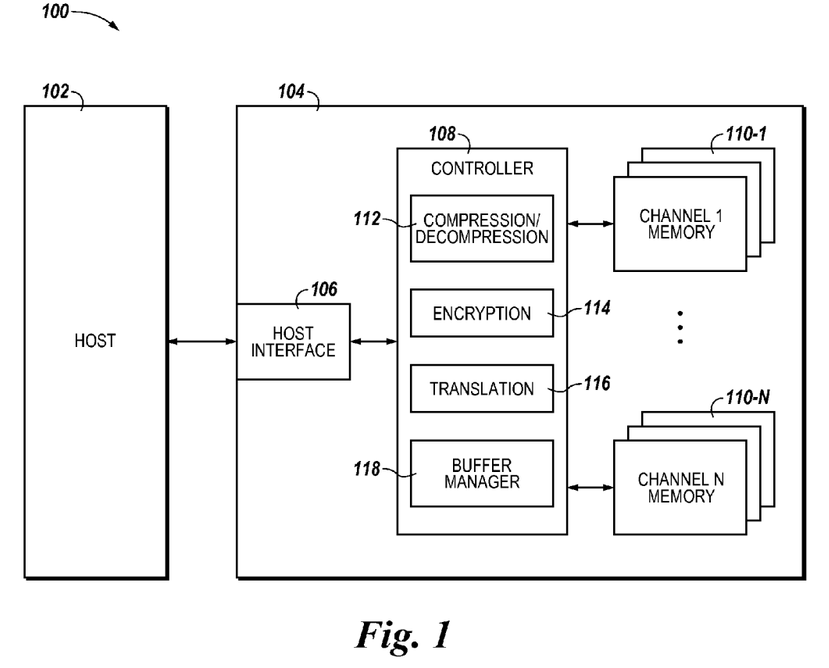
FIG. 1 is a block diagram of an apparatus in the form of a computing system including at least one memory system in accordance a number of embodiments of the present disclosure.

FIG. 1 is a block diagram of an apparatus in the form of a computing system 100 including at least one memory system 104 in accordance a number of embodiments of the present disclosure. As used herein, a memory system 104, a controller 108, or a memory device 110 might also be separately considered an "apparatus". The memory system 104 can be a solid state drive (SSD), for instance, and can include a host interface 106, a controller 108 (e.g., a processor and/or other control circuitry), and a number of memory devices 110-1, . . . , 110-N (e.g., solid state memory devices such as NAND flash devices), which provide a storage volume for the memory system 104.

As illustrated in FIG. 1, the controller 108 can be coupled to the host interface 106 and to the memory devices 110-1, . . . , 110-N via a plurality of channels and can be used to transfer data between the memory system 104 and a host 102. The interface 106 can be in the form of a standardized interface. For example, when the memory system 104 is used for data storage in a computing system 100, the interface 106 can be a serial advanced technology attachment (SATA), peripheral component interconnect express (PCIe), or a universal serial bus (USB), among other connectors and interfaces. In general, however, interface 106 can provide an interface for passing control, address, data, and other signals between the memory system 104 and a host 102 having compatible receptors for the interface 106.

Host 102 can be a host system such as a personal laptop computer, a desktop computer, a digital camera, a mobile telephone, or a memory card reader, among various other types of hosts. Host 102 can include a system motherboard and/or backplane and can include a number of memory access devices (e.g., a number of processors).

The controller 108 can communicate with the memory devices 110-1, . . . , 110-N to control data read, write, and erase operations, among other operations. The controller 108 can include, for example, a number of components in the form of hardware and/or firmware (e.g., one or more integrated circuits) and/or software for controlling access to the number of memory devices 110-1, . . . , 110-N and/or for facilitating data transfer between the host 102 and memory devices 110-1, . . . , 110-N. For instance, in the example illustrated in FIG. 1, the controller 108 includes a compression/decompression component 112 (e.g., a compression/decompression engine), an encryption component 114, a translation component 116, and a buffer management component 118.

The compression/decompression component 112 can be used to compress and/or decompress data in accordance with a number of embodiments described herein. The encryption component 114 can be used to encrypt and/or decrypt data in accordance with an encryption specification such as the advanced encryption standard (AES), for example. The translation component 116 can be used, for instance, in association with translating commands received from host 102 into appropriate commands for achieving a desired access to the number of memory devices 110-1, . . . , 110-N. For instance, host 102 may use logical addresses (e.g., logical block addresses (LBAs)), when addressing memory system 104. The translation component 116 can provide mappings from logical addresses to physical locations (e.g., physical addresses) in the memory devices 110-1, . . . , 110-N and vice versa (e.g., as part of a flash translation layer (FTL)). Such address mappings can be provided by the translation component 116 in the form of a data structure such as a table, for instance, and can allow host 102 to ignore the physical characteristics of the memory devices 110-1, . . . , 110-N, such that the storage volume of memory system 104 can be treated as a contiguous linear map of logical data segments (e.g., sectors).

The controller 108 can include other components such as buffer management component 118, among various other components, which can be used to control memory operations associated with memory system 104. As described further herein, buffer management component 118 can include a number of buffers that can be used in association with data compression and management in accordance with a number of embodiments of the present disclosure.

The memory devices 110-1, . . . , 110-N can include a number of arrays of memory cells (e.g., non-volatile memory cells). The arrays can be flash arrays with a NAND architecture, for example. However, embodiments are not limited to a particular type of memory array or array architecture. The memory cells can be grouped, for instance, into a number of blocks including a number of physical pages of memory cells. A number of blocks can be included in a plane of memory cells and an array can include a number of planes. As one example, a memory device may be configured to store 8 KB (kilobytes) of user data per page, 128 pages of user data per block, 2048 blocks per plane, and 16 planes per device.

In operation, data can be written to and/or read from a memory device of a memory system (e.g., memory devices 110-1, . . . , 110-N of system 104) as a page of data, for example. As such, a page of data can be referred to as a data transfer size of the memory system. Data can be transferred to/from a host (e.g., host 102) in data segments referred to as sectors (e.g., host sectors). As such, a sector of data can be referred to as a data transfer size of the host.

Although a page of data can comprise a number of bytes of user data (e.g., a data payload including a number of sectors of data) as well as metadata corresponding thereto, a size of a page of data often can refer only to the number of bytes used to store the user data. As an example, a page of data having a page size of 4 KB may include 4 KB of user data (e.g., 8 sectors assuming a sector size of 512B) as well as a number of bytes (e.g., 32B, 54B, 224B, etc.) of metadata corresponding to the user data. The metadata can include integrity data such as error data (e.g., error detecting and/or correcting code data) and/or address data (e.g., logical address data), among other metadata corresponding to the user data.

Figure 2:
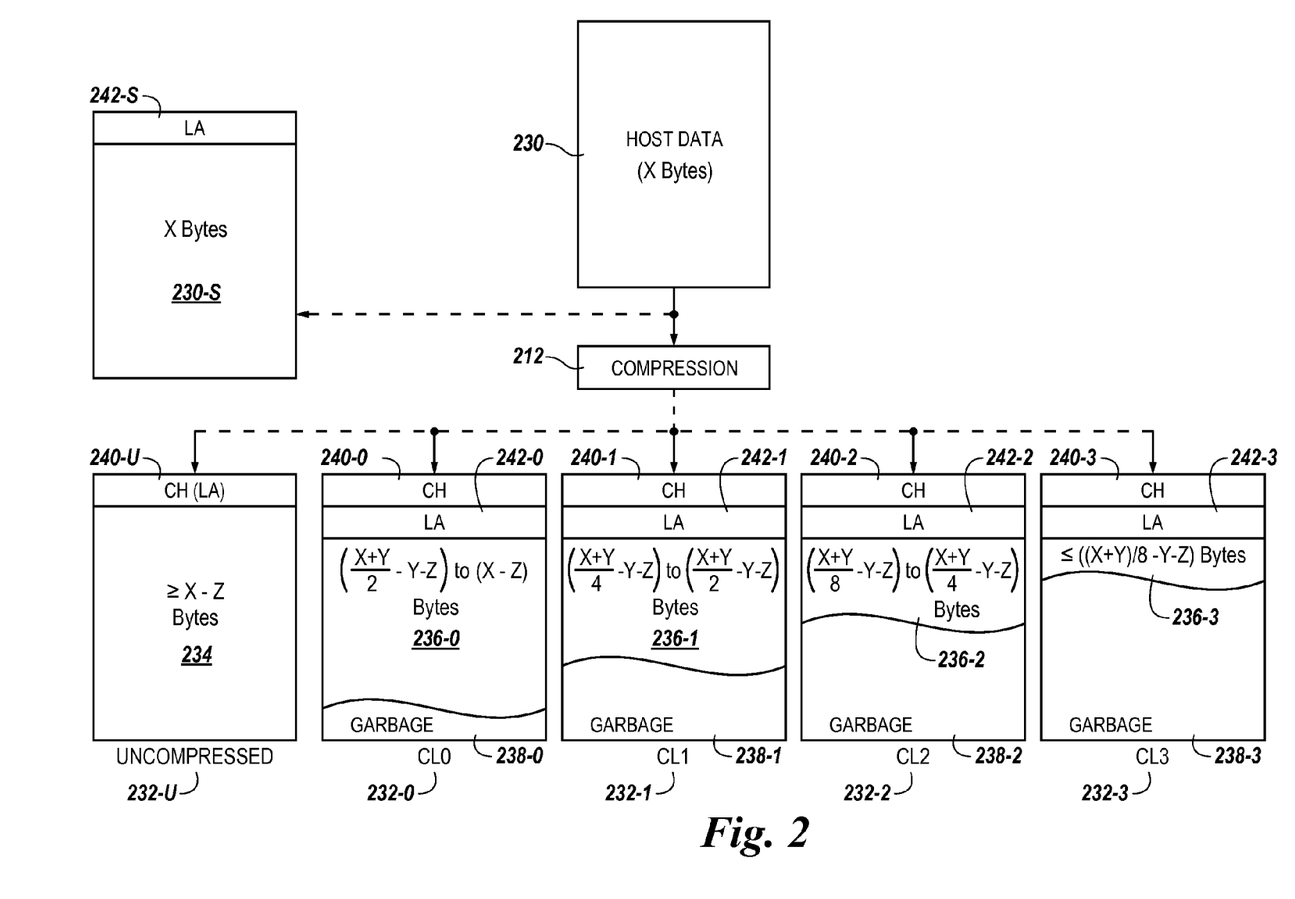
FIG. 2 is a block diagram illustrating data compression in accordance with a number of embodiments of the present disclosure.

FIG. 2 is a block diagram illustrating data compression in accordance with a number of embodiments of the present disclosure. In FIG. 2, block 230 represents a data segment (e.g., a sector of user data) received from a host (e.g., host 102 described above in connection with FIG. 1) and which is to be stored in (e.g., written to) a memory such as memory devices 110-1, . . . , 110-N shown in FIG. 1 (e.g., in connection with a write operation). Each data sector 230 can have a logical address (e.g., an LBA) corresponding thereto (e.g., associated therewith) and can have a sector size of "X" Bytes, where X can be 512B, for example. Embodiments are not limited to a particular sector size and some sectors 230 received from a host may have different sector sizes. Although one sector 230 is illustrated in FIG. 2, multiple sectors 230 can be received from a host in association with a particular write operation (e.g., a number of sectors corresponding to a number of consecutive LBAs), for instance.

As shown in FIG. 2, sector 230 can be provided to a compression component 212 such as compression/decompression component 112 of controller 108 described above in connection with FIG. 1. The compression component 212 can be configured to compress data in accordance with a number compression schemes such as Huffman coding, Shannnon-Fano coding, Fibonacci coding, Arithmetic coding, and/or Elias gamma coding, among other compression schemes.

In a number of embodiments of the present disclosure, the compression component 212 can determine a compressibility of the sector 230 (e.g., an amount by which the sector is compressible). In a number of embodiments, the compression component 212 can be configured to compress the sector 230 in accordance with its determined compressibility and to determine a compression level (CL) corresponding to a compressible sector 230 (e.g., based on its compressibility, if the sector 230 is compressible). In a number of embodiments, the compression component 212 can add a compression header (CH) to the sector 230. The compression header can, for instance, provide information such as whether or not the sector 230 is compressible, a compressibility of the sector 230 (e.g., a compression ratio corresponding to the sector), a size of the compressed sector (e.g., a number of bytes of data corresponding to the compressed sector), and/or a format of the compressed sector, among other information. The compression header can have a size of "Y" bytes, where Y can be 4B, for example.

FIG. 2 illustrates a number of different compression levels 232-U (UNCOMPRESSED), 232-0 (CL0), 232-1 (CL1), 232-2 (CL2), and 232-3 (CL3) determined based on different compressibilities of a sector 230. For instance, compression level 232-U corresponds to an uncompressed sector 234, which may be referred to as an uncompressible sector 234. An uncompressed sector 234 represents an X byte sector 230 that includes noncompressible or minimally compressible data (e.g., an X byte sector 230 that is not compressible, or that is compressible to not more than X−Z bytes where "Z" is equal to a logical address (LA) size, which can be 4B, for instance). As such, uncompressible sector 234 can include the same number of bytes as the received sector 230 (e.g., X bytes in this case). The uncompressible sector 234 also includes a compression header 240-U, which can provide an indication that the sector does not include compressed data or that the data associated with the sector is compressed by less than a minimum threshold amount (e.g., less than X−Z bytes), among other information corresponding to sector 234. As an example, the compression header 240-U corresponding to an uncompressed sector 234 can be a LA corresponding to the sector 234 and can have a size of 4B.

In the example illustrated in FIG. 2, compression level 232-0 corresponds to a compressed sector 236-0, compression level 232-1 corresponds to a compressed sector 236-1, compression level 232-2 corresponds to a compressed sector 236-2, and compression level 232-3 corresponds to a compressed sector 236-3. In the example illustrated in FIG. 2, compressed sector 236-0 represents an X byte sector 230 determined to be compressible to between X−Z bytes and (X+Y)/2−Y−Z bytes, compressed sector 236-1 represents an X byte sector 230 determined to be compressible to between (X+Y)/2−Y−Z bytes and (X+Y)/4−Y−Z bytes, compressed sector 236-2 represents an X byte sector 230 determined to be compressible to between (X+Y)/4−Y−Z bytes and (X+Y)/8−Y−Z bytes, and compressed sector 236-3 represents an X byte sector 230 determined to be compressible to less than or equal to (X+Y)/8−Y−Z bytes.

Each of the compressed sectors 236-0, 236-1, 236-2, and 236-3 have a respective amount of "garbage" data 238-0, 238-1, 238-2, and 238-3 corresponding thereto. The "garbage" data can refer to a remaining portion of a buffer in which the compressed sectors 236-0, 236-1, 236-2, and 236-3 are temporarily held. For example, if a compressed data sector (e.g., 236-0) includes 400 bytes of data and is held in a 512 byte buffer, then the garbage data portion (e.g., 238-0) would be 112 bytes of data filling a remainder of the buffer.

Each of the compressed sectors 236-0, 236-1, 236-2, and 236-3 includes a respective compression header 240-0, 240-1, 240-2, and 240-3 and logical address 242-0, 242-1, 242-2, and 242-3 corresponding thereto. The compression headers 240-0, 240-1, 240-2, and 240-3 can be, for example, 4B headers and can provide various information about the respective compressed sectors 236-0, 236-1, 236-2, and 236-3. The logical addresses 242-0, 242-1, 242-2, and 242-3 can be, for example, 4B LBAs corresponding to the respective compressed sectors 236-0, 236-1, 236-2, and 236-3. Embodiments are not limited to a particular size for the compression headers 240-0, 240-1, 240-2, and 240-3 or logical address 242-0, 242-1, 242-2, and 242-3. The CH size and the LA size can affect the compressibility ranges corresponding to the compression levels 232-U and 232-0 to 232-3, in this example.

In a number of embodiments, the compressed sectors 236-0, 236-1, 236-2, and 236-3 and uncompressed sector 234 can be encrypted (e.g., via an encryption component such as encryption component 114 shown in FIG. 1) subsequent to being compressed by compression component 212. In a number of embodiments, the compression headers 240-0, 240-1, 240-2, 240-3, and 240-U and/or logical address 242-0, 242-1, 242-2, and 242-3 may remain unencrypted (e.g., they can be routed around the encryption component).

FIG. 2 also illustrates a standard sector 230-S and a corresponding LA 242-S. As used herein, a standard sector (e.g., 230-S) can refer to a host sector (e.g., 230) that is not provided to a compression component (e.g., 212). As such, in this example, the size of sector 230-S can be 512B and the size of LA 242-S can be 4B.

As described further herein below, in a number of embodiments, a number of compressed managed units (CMUs) can be formed, which can each include a number of compressed data segments (e.g., compressed sectors 236-0, 236-1, 236-2, and 236-3) assigned thereto and a corresponding compression value, which can be based on the determined compressibilities and/or compression levels corresponding to the compressed data segments corresponding thereto. The CMUs can be assigned (e.g., via a controller) to a page of data (e.g., a logical page), which can include, for instance, metadata indicating particular locations of the number of CMUs within the page. In a number of embodiments, a page of data can be formed that includes CMUs having different corresponding compression values, for instance.

Figure 3A:
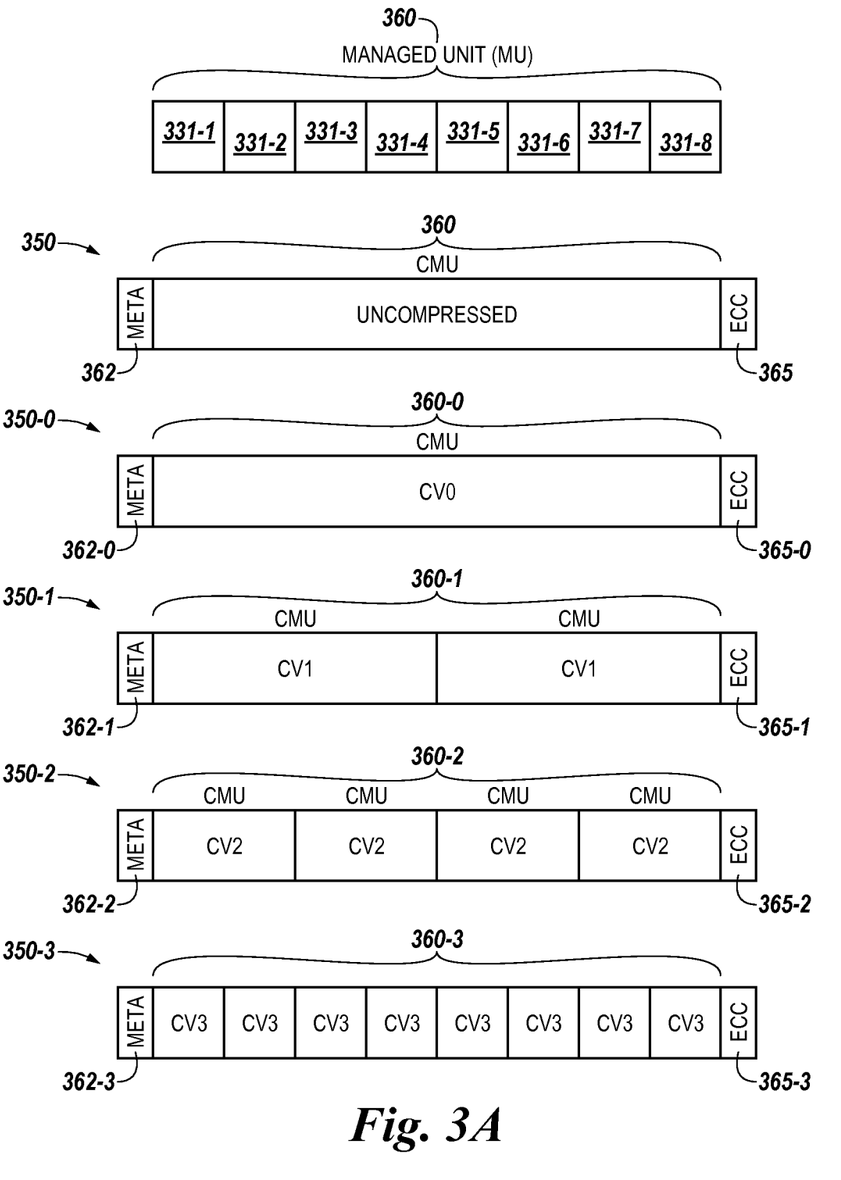
FIGS. 3A and 3B illustrate organization of a number of compressed managed units in accordance with a number of embodiments of the present disclosure.
Figure 3B:
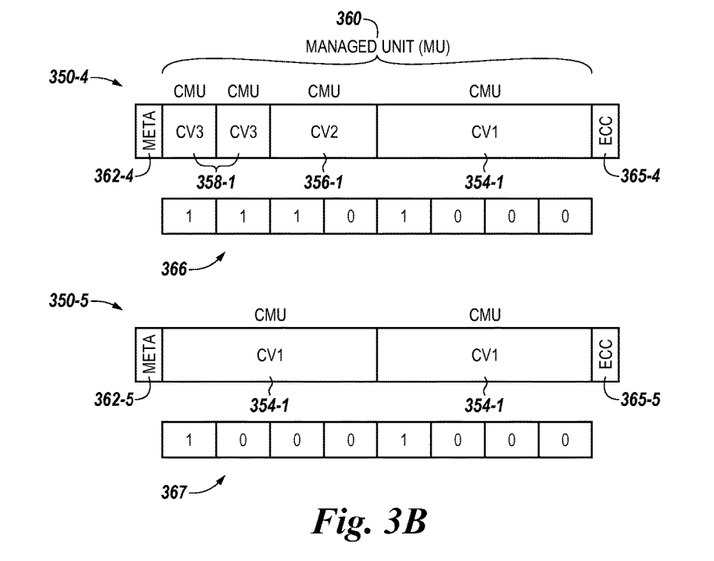

FIGS. 3A and 3B illustrates organization of a number of compressed managed units (CMUs) in accordance with a number of embodiments of the present disclosure. The examples illustrated in FIGS. 3A and 3B include a number of pages of data 350, 350-0, 350-1, 350-2, 350-3, 350-4, and 350-5. As described above, a page of data can refer to a data transfer size of a memory system such as system 104 of FIG. 1. For instance, data can be written to and/or read from a memory system one page at a time. A page of data can be configured to store a managed unit amount of user data, for instance. As used herein, a managed unit refers to an amount of data corresponding to a particular number of (e.g., "N") uncompressed data segments (e.g., host sectors and corresponding logical addresses) managed by a translation component (e.g., a FTL) such as translation component 116 shown in FIG. 1. As an example, and as shown in FIG. 3A, a managed unit (MU) 360 can comprise an amount of data corresponding to 8 data segments (e.g., 8 host sectors 331-1 to 331-8 along with their 8 respective LAs). As such, assuming an uncompressed host sector size of 512B and a LA size of 4B, a managed unit amount of data 360 can be 4,128B (e.g., 516B/sector×8 sectors). Embodiments are not limited to a particular managed unit size, and a page of data can be configured to store more than one managed unit amount of data 360.

In the examples illustrated in FIGS. 3A and 3B, each of the pages of data 350, 350-0, 350-1, 350-2, 350-3, 350-4, and 350-5 comprises one managed unit amount of data 360 (e.g., eight 516B data segments corresponding to a 512B host sector size and a 4B LA size). Each of the pages 350-0, 350-1, 350-2, 350-3, 350-4, and 350-5 includes a payload portion including one or more compressed managed units (CMUs) as well as metadata corresponding thereto. A CMU refers to a managed unit amount of data 360 which has undergone compression (e.g., via a compression component such as 112 shown in FIG. 1). Since one or more of the data segments (e.g., 331-1 to 331-8) corresponding to an MU may not be compressible, or may be minimally compressed (e.g., uncompressible sector 234 shown in FIG. 2), the size of a CMU can vary. For instance, a CMU can have the same and/or similar size of an MU (e.g., all of the sectors are uncompressible or minimally compressible), or can have a reduced size (e.g., one or more of the number of data segments corresponding to an MU are compressible). As such, a page of data corresponding to a managed unit amount of data 360 can comprise multiple CMUs (e.g., multiple CMUs may be assigned to a page of data).

In the example shown in FIGS. 3A and 3B, each of pages 350, 350-0, 350-1, 350-2, 350-3, 350-4, and 350-5 includes respective metadata 362, 362-0, 362-1, 362-3, 362-4, and 362-5, as well as respective metadata 365, 365-0, 365-1, 365-3, 365-4, and 365-5. As described further herein, metadata 362, 362-0, 362-1, 362-3, 362-4, and 362-5 can include topology metadata indicating an organization of CMUs within (e.g., assigned to) the respective pages. As an example, the metadata 362, 362-0, 362-1, 362-3, 362-4, and 362-5 can indicate how the number of CMUs corresponding to the respective pages are arranged within a page and/or a compression value corresponding to the respective number of CMUs corresponding to the respective pages. As an example, metadata 362, 362-0, 362-1, 362-3, 362-4, and 362-5 can include topology metadata such as topology metadata 366 and 367 illustrated in FIG. 3B. In the example illustrated in FIGS. 3A and 3B, metadata 365, 365-0, 365-1, 365-3, 365-4, and 365-5 includes error data (e.g., error correction code (ECC) data) corresponding to one or more CMUs corresponding to a respective page. Embodiments are not limited to a particular type of error data and may include a cyclic redundancy check (CRC) code, for instance.

In FIGS. 3A and 3B, the pages of data 350, 350-0, 350-1, 350-2, 350-3, 350-4, and 350-5 each include a number of CMUs. As an example, each CMU can include a particular number of (e.g., 8) compressed and/or uncompressed sectors (e.g., compressed sectors 236-0, 236-1, 236-2, 236-3 and/or uncompressed sector 234 shown in FIG. 2) assigned thereto (e.g., by a controller). As such, each CMU can include data corresponding to a particular number of (e.g., 8) LBAs. In a number of embodiments, each CMU can include data corresponding to consecutive LBAs (e.g., data sectors corresponding to LBAs 0-7 can be assigned to a particular CMU and data sectors corresponding to LBAs 8-15) can be assigned to a different CMU). As described above in connection with FIG. 2, a compression level (e.g., UNCOMPRESSED, CL0, CL1, CL2, and CL3) can be determined for each respective sector (e.g., based on its compressibility or lack of compressibility). The compression level can represent a compressibility range. For instance, in the example illustrated in FIG. 2, sectors (e.g., host sectors 230+Z, where Z is equal to a LA size) compressed to between X bytes and X−Z bytes correspond to uncompressible or minimally compressible sectors (UNCOMPRESSED), sectors compressed to between X−Z bytes and (X+Y)/2−Y−Z bytes correspond to compression level CL0, sectors compressed to between (X+Y)/2−Y−Z bytes and (X+Y)/4−Y−Z bytes correspond to compression level CL1, sectors compressed to between (X+Y)/4−Y−Z bytes and (X+Y)/8−Y−Z bytes correspond to compression level CL2, and sectors compressed to less than (X+Y)/8−Y−Z bytes correspond to compression level CL3. In a number of embodiments, the number of compression levels can be fixed; however, embodiments are not limited to a particular number of compression levels (e.g., there can be more than or fewer than four different compression levels and an uncompressed level).

In a number of embodiments, each CMU can have a particular compression value corresponding thereto (e.g., CV0, CV1, CV2, and CV3, or uncompressed). The compression values corresponding to the respective CMUs can indicate the amount of space (e.g., in bytes) allotted to the respective compressed sectors assigned to the respective CMUs and can be based on, for example, determined compression levels (e.g., CL0, CL1, CL2, and CL3, or uncompressed) corresponding to the respective compressed sectors assigned to the respective CMUs. For instance, assuming an uncompressed sector size of 512B, a CH size of 4B, and an LA size of 4B, a compression level of CL0 can indicate a compressed sector size of between 508B and 250B, a compression level of CL1 can indicate a compressed sector size of between 250B and 120B, a compression level of CL2 can indicate a compressed sector size of between 120B and 56B, and a compression level of CL3 can indicate a compressed sector size of less than or equal to 56B. As an example, the compression values (e.g., CV0, CV1, CV2, and CV3, or uncompressed) can correspond to an uppermost compressed sector size corresponding to a particular compression level (e.g., CL0, CL1, CL2, and CL3, or uncompressed). For instance, compression value CV0 can indicate a 508B space allotment per compressed sector corresponding to a particular CMU (e.g., with 508B being the uppermost compressed sector size corresponding to compression level CL0). Similarly, compression value CV1 can indicate a 250B space allotment per compressed sector corresponding to a particular CMU (e.g., with 250B being the uppermost compressed sector size corresponding to compression level CL1). Also, compression value CV2 can indicate a 120B space allotment per compressed sector corresponding to a particular CMU (e.g., with 120B being the uppermost compressed sector size corresponding to compression level CL2), and compression value CV3 can indicate a 56B space allotment per compressed sector corresponding to a particular CMU (e.g., with 56B being the uppermost compressed sector size corresponding to compression level CL3). A compression value of "uncompressed" can indicate that an MU amount of data (e.g., 516B) is compressible to not less than 508B. As such, in a number of embodiments, compression values (e.g., CV0, CV1, CV2, and CV3, or uncompressed) can correspond to compression ratios. For instance, in the example above, CV1 can correspond to a compression ratio of 1/2, CV2 can correspond to a compression ratio of 1/4, and CV3 can correspond to a compression ratio of 1/8. Embodiments are not limited to these examples.

In a number of embodiments, the compression value (e.g., CV0, CV1, CV2, and CV3, or uncompressed) corresponding to a CMU can be determined based on a least compressible sector of the respective number of (e.g., N) compressed sectors corresponding to an MU amount of data). For example, if an MU corresponds to eight sectors (e.g., MU 360) of data, with six of the sectors having a compression level of CL3 and two of the sectors having a compression level of CL2, then a compression value of CV2, which corresponds to compression level of CL2, can be assigned to the CMU. As such, a space allotment of 120B per compressed sector may be provided for the CMU, despite those compressed sectors having a compression level of CL3 being compressed to 56B or less. As such, a compression value can also indicate a space allotment (e.g. size) of a particular CMU. In this example, a CMU comprising eight compressed sectors (e.g., a CMU corresponding to eight LBAs) and having a compression value of CV2 can indicate a CMU size of about 1 KB (e.g., 120B per compressed sector+a 4B CH per sector and a 4B LA per sector×8 sectors per CMU). Embodiments are not limited to this example.

In the example illustrated in FIG. 3A, page 350 includes one CMU having a compression value of "uncompressed." That is, the CMU of page 350 comprises uncompressed or minimally compressed data segments corresponding to an MU amount of data 360. For instance, the "N" data segments of the MU 360 corresponding to page 350 are segments such as data segments 234 described in connection with FIG. 2. In the example illustrated in FIG. 3A, page 350-0 includes one CMU having a corresponding compression value of CV0. Page 350-1 includes two CMUs each having a corresponding compression value of CV1. Page 350-2 includes four CMUs each having a corresponding compression value of CV2. Page 350-3 includes eight CMUs each having a corresponding compression value of CV3.

In instances in which host sectors (e.g., sector 230 shown in FIG. 2) are not compressible, a page having a fixed page size can comprise a fixed number of sectors (e.g., a fixed number of LBAs each corresponding to a respective fixed size sector). For instance, a 4 KB page size can comprise eight uncompressed sectors (e.g., eight LBAs each corresponding to a respective 512B sector). Data compression and management in accordance with embodiments described herein can increase the number of sectors (e.g., LBAs) corresponding to a particular page size and/or can provide the ability to provide pages of data comprising different numbers of sectors, which can increase the storage capacity and/or improve the throughput of memory systems as compared to previous data compression and management systems, among other benefits.

Consider an example in which each of the pages 350, 350-0, 350-1, 350-2, and 350-3 have a 4128B page size (e.g., 4 KB of user data plus LA data) and each CMU comprises eight compressed and/or uncompressed sectors (e.g., eight LBAs each corresponding to a respective 512B sector) along with their corresponding 4B CH and/or 4B LA. For this example, assume compression value "uncompressed" corresponding to the CMU of page 350 indicates that the eight sectors corresponding to the CMU are allotted 516B (e.g., each of the sectors corresponding to the CMU is compressed to at most 508B plus a 4B CH). As such, the space allotment (e.g., size of) the CMU of page 350 is 4128B (e.g., 516B×8 uncompressed or minimally compressed sectors) and the total size of page 350 is 4128B (e.g., 4128B per CMU×1 CMU per page). In this example, assume compression value CV0 indicates that the eight sectors corresponding to the CMU is allotted 508B (e.g., each of the sectors corresponding to the CMU is compressed to between 250B and 508B. Similar to page 350, the space allotment of the CMU of page 350-0 is 4128B such that the size of page 350-0 is 4128B (e.g., page 350 accommodates 8 host sectors compressed to between 250B and 508B plus a 4B CH per sector and a 4B LA per sector). For the example shown in FIG. 3A, assume compression value CV1 corresponding to the two CMUs of page 350-1 indicates that each of the eight compressed sectors corresponding to a respective CMU is allotted 250B (e.g., each of the compressed sectors has been compressed to 250B or less). As such, the space allotment for (e.g., size of) each CMU of page 350-1 is 2064B (e.g., 250B×8 compressed sectors plus a 4B CH per sector and a 4B LA per sector) and the total size of page 350-1 is 4128B (e.g., 2064B per CMU×2 CMUs per page), which matches the 4128B page size. However page 350-1 comprises twice as many sectors (e.g., 16) as pages 350 and 350-0 (e.g., pages comprising CMUs having compression values of uncompressed or CV0), which comprise 8 sectors. For this example, assume compression value CV2 corresponding to the four of page 350-2 indicates that each of the four compressed sectors corresponding to a respective CMU is allotted 120B (e.g., each of the compressed sectors has been compressed to 120B or less). As such, the size of each CMU is 1024B (e.g., 120B×8 compressed sectors plus a 4B CH per sector and a 4B LA per sector) such that the payload portion of page 350-2 is 4096B (e.g., 1024B per CMU×4 CMUs per page), which is slightly less than the 4128B page size. However page 350-2 comprises four times as many sectors (e.g., 32) as pages 350 and 350-0 (e.g., pages comprising CMUs having compression values of uncompressed or CV0), which comprise 8 sectors. For this example, assume compression value CV3 corresponding to the eight CMUs of page 350-3 indicates that each of the eight compressed sectors corresponding to a respective CMU is allotted 56B (e.g., each of the compressed sectors has been compressed to 56B or less). As such, the size of each CMU is 512B (e.g., 56B×8 compressed sectors plus a 4B CH sector and a 4B LA per sector) such that the payload portion of page 350-3 is 4096B (e.g., 512B per CMU×8 CMUs per page), which is slightly less than the 4128B page size. However page 350-3 comprises eight times as many sectors (e.g., 64) as pages 350 and 350-0 (e.g., pages comprising CMUs having compression values of uncompressed or CV0), which comprise 8 sectors.

FIG. 3B illustrates pages 350-4 and 350-5, which can be formed in accordance with embodiments described herein. As illustrated in FIG. 3B, pages 350-4 and 350-5 comprise a number of CMUs having different corresponding compression values. As illustrated, the CMUs of pages 350-4 and 350-5 fit within a space allocation equal to an MU amount of data 360. In this example, page 350-4 includes two CMUs 358-1 having a compression value of CV3, one CMU 356-1 having a compression value of CV2, and one CMU 354-1 having a compression value of CV1. Page 350-5 includes two CMUs 354-1 each having a compression value of CV1.

FIG. 3B also illustrates an example of topology metadata 366 corresponding to page 350-4 and topology metadata 367 corresponding to page 350-5. The topology metadata can be included within respective metadata fields 362-4 and 362-5 and can indicate a manner in which the CMUs are organized within a respective page, for instance. In the example shown in FIG. 3B, the topology metadata (e.g., 366 and 367) comprises an 8-bit pattern which can indicate the compression values of the respective CMUs within a particular page 350-4/350-5, as well as how the CMUs are positioned within the particular page.

In the example shown in FIG. 3B, the topology metadata 366 comprises bit pattern "11101000", which can indicate the particular locations of the respective number of CMUs 358-1, 356-1, and 354-1 within the page 350-4 as well as the compression values of those respective CMUs. Similarly, topology metadata 367 comprises bit pattern "10001000", which can indicate the particular locations of the respective number of CMUs 354-1 within page 350-5 as well as the compression values of those respective CMUs.

As described further below, in a number of embodiments, the topology metadata (e.g., 366/367) can be stored in memory (e.g., memory devices 110-1, . . . , 110-N shown in FIG. 1) along with a corresponding page of data (e.g., as at least a portion of metadata 362-1 to 362-5). The topology metadata can be retrieved from the memory (e.g., in association with a read operation) in order to determine the organization of the number of CMUs within the particular page of data.

Embodiments are not limited to the examples described in connection with FIGS. 3A and 3B. For instance, as described further below in connection with FIGS. 6-7, in a number of embodiments, a compression operation can be performed on a managed unit amount of the received data to be stored in memory, and the CMU can include compressed and/or uncompressed data segments corresponding to the MU. The number of (e.g., N) data segments (e.g., sectors) corresponding to the MU amount of data can be compressed as a group (e.g., forming a CMU amount of data) or the N sectors can be compressed individually and then combined to form the CMU. The CMU can be assigned to a page of data that comprises at least that CMU, which begins on one of a number of quantized boundaries of the page, with a space allocation between each of the successive quantized boundaries capable of accommodating an uncompressed data segment.

Figure 4:
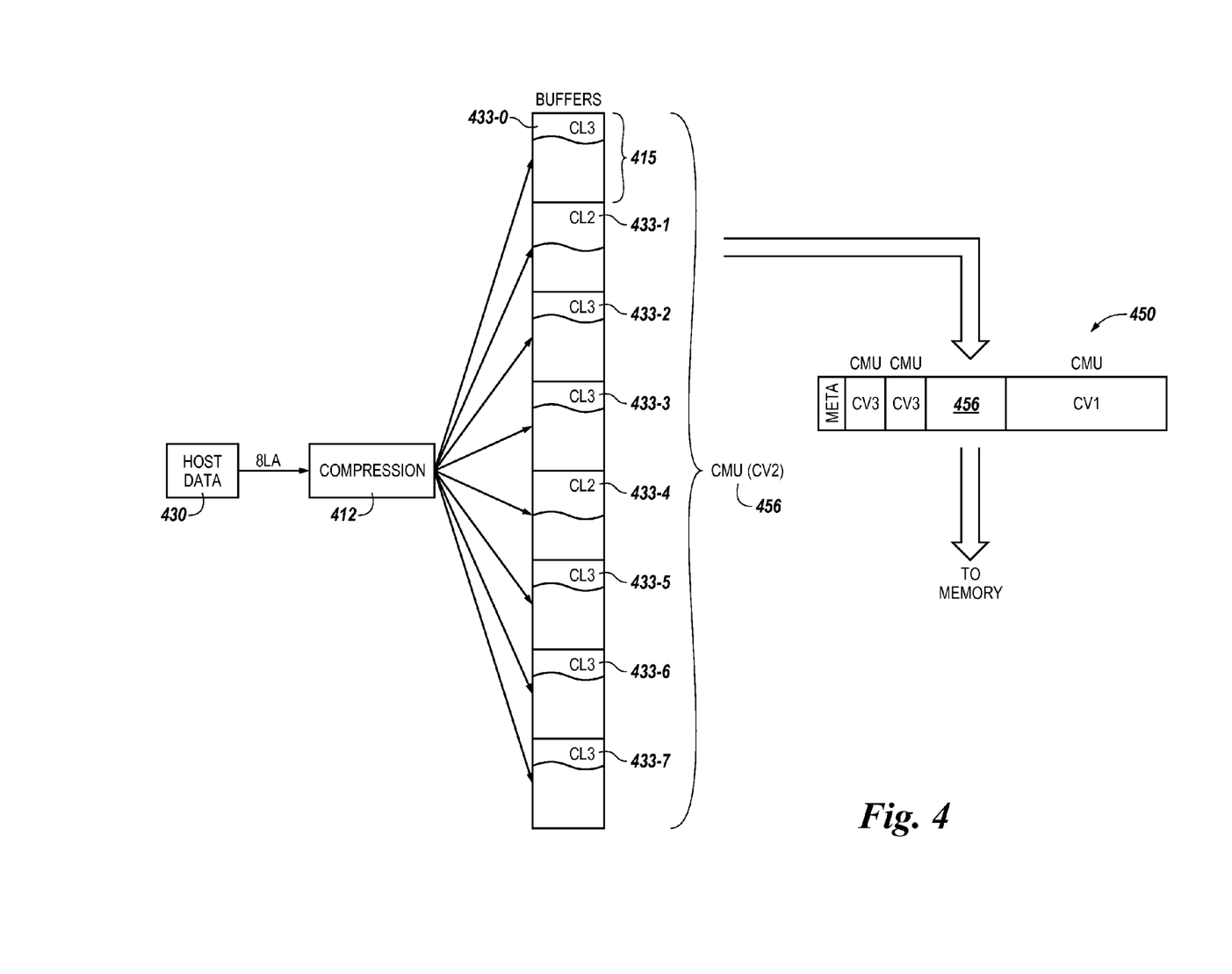
FIG. 4 illustrates a functional flow diagram corresponding to data compression and management in accordance with a number of embodiments of the present disclosure.

FIG. 4 illustrates a functional flow diagram corresponding to data compression and management in accordance with a number of embodiments of the present disclosure. In FIG. 4, box 430 represents a number of data segments received from a host (e.g., a number of sectors of data received from a host such as host 102 shown in FIG. 1) and provided to a compression component 412 (e.g., in association with a write operation). The compression component can be a compression component such as compression component 212 shown in FIG. 2 or compression/decompression component 112 shown in FIG. 1. In this example, data corresponding to eight logical addresses (LAs) is provided to compression component 412. The eight LAs can correspond to eight sectors (e.g., eight 512B uncompressed host sectors), which can correspond to a managed unit amount of data. As such, in a number of embodiments, and in the example illustrated in FIG. 4, each CMU can comprise eight sectors worth of user data (e.g., user data corresponding to eight logical addresses). In a number of embodiments, the LAs can be consecutive logical addresses such that each CMU comprises sectors corresponding to eight consecutive LBAs, for instance. However, embodiments are not so limited.

As illustrated in FIG. 4, the received data 430 can be compressed by compression component 412 (e.g., in accordance with their respective compressibilities) and the compressed sectors 433-0 to 433-7 can be provided to respective buffers 415. As described above, a compression level can be determined for each of the respective compressed sectors 433-0 to 433-7. In this example, compressed sectors 433-0, 433-2, 433-3, 433-5, 433-6, and 433-7 each have a compression level of CL3, and the compressed sectors 433-1 and 433-4 each have a compression level of CL2. As an example, compression level CL2 can correspond to a sector compressed to between 120B and 56B and compression level CL3 can correspond to a sector compressed to 56B or less.

A CMU 456 can be formed which comprises the eight compressed sectors 433-0 to 433-7 (e.g., the compressed data corresponding to the MU amount of received data). The CMU 456 can be assigned a compression value, which can be based on the determined compression levels and/or compressibilities of the compressed sectors 433-0 to 433-7. The assigned compression value can be based, for instance, on a least compressible sector of the number of sectors 433-0 to 433-7. For instance, in this example, the assigned compression value is CV2, which corresponds to the compression level CL2 of sectors 433-1 and 433-4.

As illustrated in FIG. 4, the CMU 456 can be assigned to a page 450 comprising a number of CMUs. In this example, the page 450 comprises four CMUs; however, as described above, a page of data can comprise more or fewer than four CMUs. It is noted that for this example, the two CMUs having a compression value of CV3 may correspond to 512B, while the CMU 456 having a compression value of CV2 may correspond to 1024 bytes, and the CMU having a compression value of CV1 may correspond to 2064B, for a total of 4112B, which is less than the 4128 page size. However, the total size of the CMUs as compared to the total page size can provide acceptable compression gain. The page 450 can be stored in memory (e.g., written to a physical page of memory cells). That is, the CMUs assigned to logical page 450 can be stored in a physical page of memory cells of the memory. A logical page size may or may not be the same as a physical page of memory cells.

Figure 5:
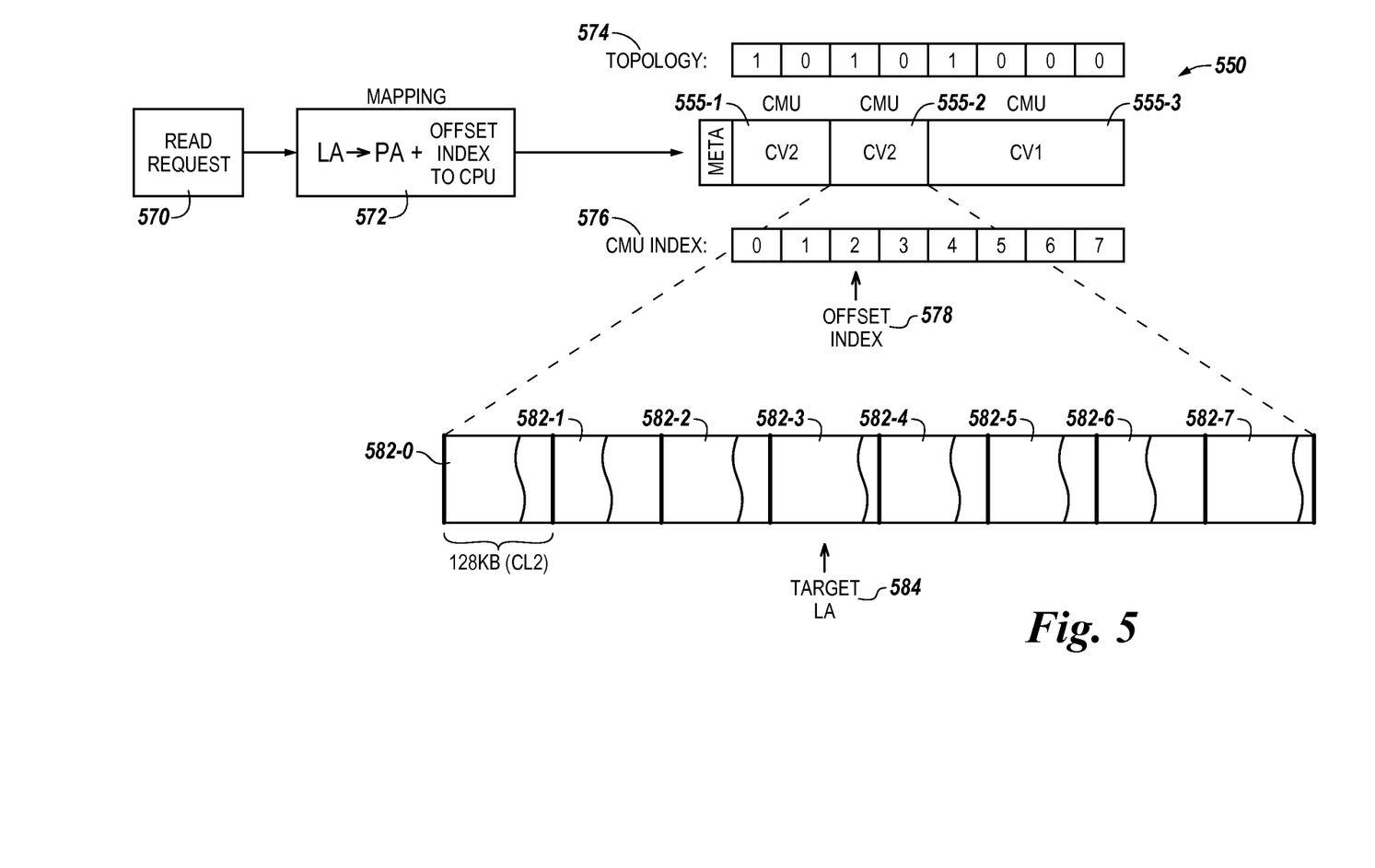
FIG. 5 illustrates a functional flow diagram associated with data compression and management in accordance with a number of embodiments of the present disclosure.

FIG. 5 illustrates a functional flow diagram corresponding to data compression and management in accordance with a number of embodiments of the present disclosure. The example shown in FIG. 5 includes a page 550 that comprises a number of CMUs 555-1, 555-2, and 555-3 and metadata (META). The CMUs 555-1, 555-2, and 555-3 can be CMUs such as those described above in connection with FIGS. 2, 3A, 3B, and 4. In the example illustrated in FIG. 5, The CMUs 555-1, 555-2, and 555-3 each comprise eight compressed sectors of data (e.g., compressed data corresponding to eight LBAs). The CMUs 555-1 and 555-2 have a corresponding compression value of CV2 assigned thereto, which in this example indicates a space allotment per sector of 120B (e.g., each compressed sector assigned to CMUs 555-1 and 555-2 is compressed to 120B or less). As shown in FIG. 5, CMU 555-2 comprises compressed sectors 582-0 to 582-7.

The metadata (META) of page 550 can include topology metadata 574 (e.g., topology metadata 366 and 367 described in FIG. 3B), which can indicate the physical organization of the CMUs 555-1, 555-2, and 555-3 within page 550 as well as the respective compression values corresponding thereto. The metadata (META) of page 550 can also include a CMU index 576, which can be used to, for instance, locate a starting location of a particular CMU 555-1, 555-2, and 555-3 within page 550.

FIG. 5 illustrates an example of accessing a target CMU corresponding to a target logical address (e.g., in association with a read operation) in accordance with a number of embodiments of the present disclosure. For instance, block 570 shown in FIG. 5 represents a read request corresponding to target logical address 584 corresponding to CMU 555-2 of page 560. The read request can be initiated by a host (e.g., host 102 described in FIG. 1) and/or a controller (e.g., controller 108 described in FIG. 1), for instance.

In a number of embodiments, a data structure such as an address translation table can be stored in memory (e.g., DRAM, SRAM, etc.) on a controller, and/or at least a portion of the address translation table can be stored in memory such as a number of memory devices (e.g., 110-1, ..., 110-N), to which the controller is coupled. The address translation table can be maintained by a translation component such as translation component 116 described in FIG. 1 and can include logical address to physical address mappings.

For instance, in the example illustrated in FIG. 5, mapping 572 indicates a physical address corresponding to page 550 to which the target logical address 584 is assigned. In a number of embodiments, and as shown in FIG. 5, the mapping 572 also includes an offset index (e.g., 578) to the particular CMU (e.g., 555-2) corresponding to the target logical address 584. In operation, the physical address provided by mapping 572 can be used to locate the page 550 in the number of memory devices. The topology metadata 574 can be retrieved from the metadata (META) of the page 550. As noted above, the topology metadata 574 indicates the physical organization of the CMUs (e.g., 555-1, 555-2, and 555-3) within page 550 (e.g., the particular locations of the CMUs within the page, the compression values corresponding thereto, etc.). The offset index provided by mapping 572 can indicate the starting position of the target CMU within page 550.

For instance, in the example shown in FIG. 5, the offset index 578 (e.g., "2") indicates the starting position within page 550 of the target CMU 555-2. Based on the known compression value assigned to target CMU 555-2 (e.g., CV2 in this example), the sectors (e.g., 582-0 to 582-7) corresponding to target CMU 555-2 can be effectively traversed. The target logical address 584 can be located, and the compressed data 582-3 corresponding thereto can be transferred to the host to complete the read operation corresponding to read request 570. In a number of embodiments, the compressed data (e.g., 582-3) corresponding to the target logical address (e.g., 584) can be decompressed (e.g., via a compression/decompression component such as compression/decompression component 112 shown in FIG. 1) prior to transfer to the host.

Figure 6A:
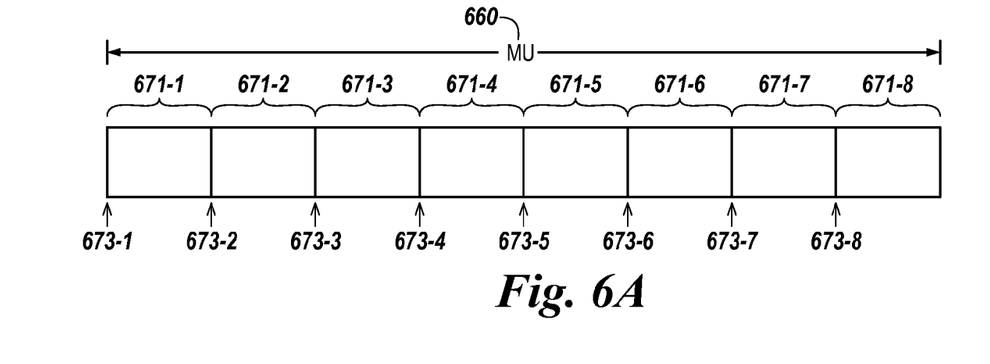
FIG. 6A illustrates a managed unit in accordance with a number of embodiments of the present disclosure.

FIG. 6A illustrates a managed unit 660 in accordance with a number of embodiments of the present disclosure. As described above, a managed unit (MU) can refer to an amount of data (e.g., a size) corresponding to a number of uncompressed data segments (e.g., sectors). A compression operation can be performed on an MU worth of data segments to form a CMU. As described above, the number of data segments (e.g., N) corresponding to an MU can be eight, for instance, and may or may not be compressible via a compression operation such that one or more CMUs may fit within a space allotment corresponding to an MU. For instance, if "N" sectors corresponding to an MU 660 are not compressible, or are minimally compressible, then only one CMU comprising the "N" sectors may fit within the space allotment corresponding to MU 660.

As an example, MU 660 can represent a space allotment equal to eight uncompressed 512B host sectors (e.g., 4 KB). In a number of embodiments, and as illustrated in FIG. 6A, the space allotment corresponding to an MU (e.g., 660) can be divided into a number of quantized space allocations (e.g., 671-1 to 671-8) corresponding to the "N" sectors (e.g., eight 512B sectors). As such, the MU 660 shown in FIG. 6A includes a number of quantized boundaries 673-1 to 673-8 corresponding to the respective space allocations 671-1 to 671-8. Therefore, a space allocation between each successive quantized boundary 673-1 to 673-8 is capable of accommodating an uncompressed sector.

Figure 6B:
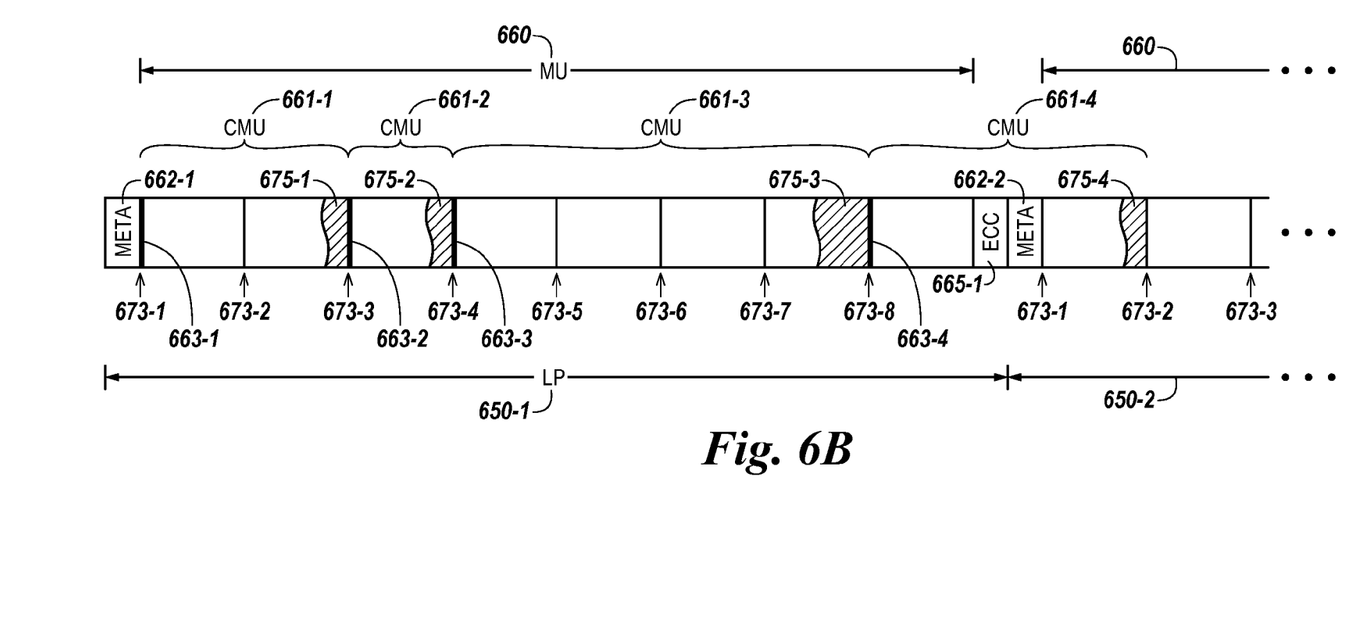
FIG. 6B illustrates a number of CMUs assigned to a number of pages of data in accordance with a number of embodiments of the present disclosure.

FIG. 6B illustrates a number of CMUs 661-1, 661-2, 661-3, 661-4 assigned to a number of pages of data 650-1 and 650-2 in accordance with a number of embodiments of the present disclosure. In a number of embodiments, a page can accommodate an MU amount of data 660, with an MU corresponding to N (e.g., 8) uncompressed sectors. For instance, as illustrated in FIG. 6B, page 650-1 can accommodate an MU amount of data 660 and page 650-2 can accommodate an MU amount of data 660. In this example, the pages 650-1 and 650-2 include metadata (e.g., 662-1 and 662-2), which can indicate a physical organization of the CMUs within a respective page and error data (e.g., 665-1), such as ECC data, corresponding to the page.

As described above, each of the CMUs 661-1, 661-2, 661-3, 661-4 can correspond to an MU amount of data (e.g., N sectors, where N can be 8, for instance). Each CMU assigned to a page can include user data corresponding to eight compressed or uncompressed sectors. As an example, each of CMUs 661-1 to 661-4 includes user data corresponding to eight compressed sectors (e.g., N is equal to 8).

In a number of embodiments, and as illustrated in FIG. 6B, each of the CMUs of a page begins on one of a number of quantized boundaries of the page. As shown in FIG. 6B, the quantized boundaries of a page can correspond to the quantized space allocations associated with an MU (e.g., 660). In a number of embodiments, the CMUs of a page also end on a quantized boundary of a page; however, a CMU may begin on a quantized boundary of a first page (e.g., 650-1) and end on a quantized boundary of a different page (e.g., 650-2).

In the example of FIG. 6B, pages 650-1 and 650-2 include eight quantized boundaries 673-1 to 673-8 corresponding to the eight respective space allocations 671-1 to 671-8 associated with MU 660. CMU 661-1 begins on quantized boundary 673-1 of page 650-1 and ends on boundary 673-3 such that it spans two space allocations. In this example, the user data corresponding to CMU 661-1 is compressed to an amount less than two full space allocations. As such, CMU 661-1 comprises an amount of garbage data 675-1, which can be used to fill a buffer (not shown) corresponding to CMU 661-1. CMU 661-2 begins on quantized boundary 673-3 of page 650-1 and ends on boundary 673-4 such that it spans one space allocation. In this example, the user data corresponding to CMU 661-2 is compressed to an amount less than one full space allocation. As such, CMU 661-2 comprises an amount of garbage data 675-2. CMU 661-3 begins on quantized boundary 673-4 of page 650-1 and ends on boundary 673-8 such that it spans four space allocations. In this example, the user data corresponding to CMU 661-3 is compressed to an amount less than four full space allocations. As such, CMU 661-3 comprises an amount of garbage data 675-3. CMU 661-4 begins on quantized boundary 673-8 of page 650-1 and ends on boundary 673-2 of page 650-2 such that it spans two space allocations. In this example, the user data corresponding to CMU 661-4 is compressed to an amount less than two full space allocations. As such, CMU 661-4 comprises an amount of garbage data 675-4.

Each of the CMUs 661-1 to 661-4 includes a respective metadata field 663-1 to 663-4. The metadata fields 663-1 to 663-4 can indicate, for instance, a size (e.g., length) of the corresponding CMU, a starting location of a next CMU, and/or other information associated with the CMUs. In a number of embodiments, the CMUs (e.g., 661-1 to 661-4) may not include separate respective metadata fields, or the metadata fields (e.g., 663-1 to 663-4) may be located at positions other than at the beginning of a corresponding CMU.

Figure 6C:
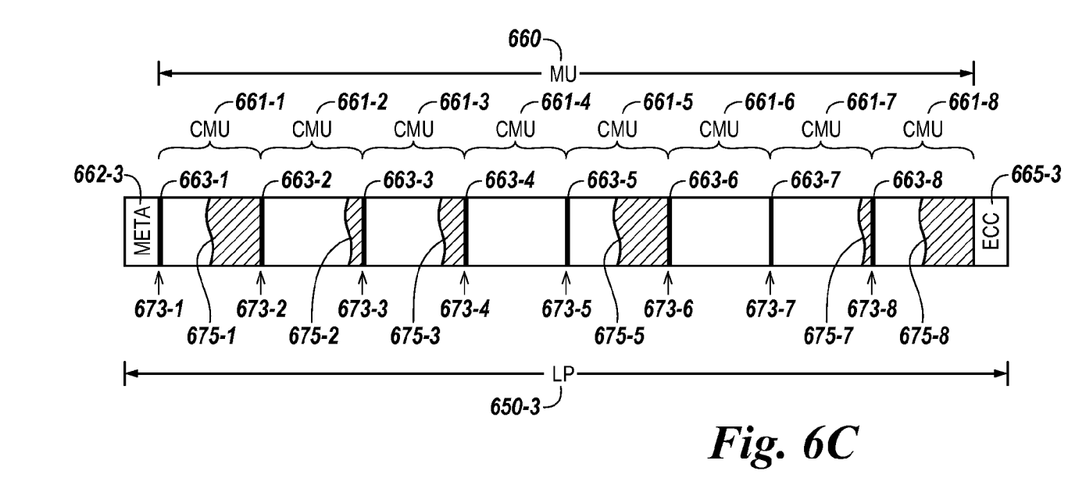
FIG. 6C illustrates a number of CMUs assigned to a page of data in accordance with a number of embodiments of the present disclosure.

FIG. 6C illustrates a number of CMUs 661-1 to 661-8 assigned to a page of data 650-3 in accordance with a number of embodiments of the present disclosure. The page 650-3 can accommodate an MU amount of data 660, such as an amount of data corresponding to eight uncompressed sectors. In this example, the page 650-3 includes metadata 662-3, which can indicate a physical organization of the CMUs within the page and error data 665-3, such as ECC data, corresponding to the page.

As described above, each of the CMUs 661-1 to 661-8 can correspond to eight sectors (e.g., assuming MU 660 corresponds to an amount of data equal to eight sectors plus the corresponding LAs). As such, each CMU 661-1 to 661-8 assigned to page 650-3 can include user data corresponding to eight compressed or uncompressed sectors. In this example, each of CMUs 661-1 to 661-8 includes user data corresponding to eight compressed sectors (e.g., N is equal to 8 and each of the CMUs correspond to eight host sectors which were compressible).

In the embodiment illustrated in FIG. 6C, each of the CMUs 661-1 to 661-8 of page 650-3 begins on one of the number of quantized boundaries 673-1 to 673-8 of the page. In this example, page 650-3 include eight quantized boundaries 673-1 to 673-8 corresponding to the eight respective space allocations 671-1 to 671-8 associated with MU 660. In the example shown in FIG. 6C, each of the CMUs 661-1 to 661-8 include user data compressible such that it fits between successive boundaries of the eight quantized boundaries 673-1 to 673-8 (e.g., each of the CMUs 661-1 to 661-8 fits within a single space allocation of the eight space allocations 671-1 to 671-3 shown in FIG. 6A). CMU 661-1 begins on quantized boundary 673-1 of page 650-3 and ends on boundary 673-2 and comprises an amount of garbage data 675-1, which can be used to fill a buffer (not shown) corresponding to CMU 661-1. CMU 661-2 begins on quantized boundary 673-2 of page 650-3 and ends on boundary 673-3 and comprises an amount of garbage data 675-2. CMU 661-3 begins on quantized boundary 673-3 of page 650-3 and ends on boundary 673-4 and comprises an amount of garbage data 675-3. CMU 661-4 begins on quantized boundary 673-4 of page 650-3 and ends on boundary 673-5 and does not comprise an amount of garbage data. CMU 661-5 begins on quantized boundary 673-5 of page 650-3 and ends on boundary 673-6 and comprises an amount of garbage data 675-5. CMU 661-6 begins on quantized boundary 673-6 of page 650-3 and ends on boundary 673-7 and does not comprise an amount of garbage data. CMU 661-7 begins on quantized boundary 673-7 of page 650-3 and ends on boundary 673-8 and comprises an amount of garbage data 675-7. CMU 661-8 begins on quantized boundary 673-8 of page 650-3, spans space allocation 671-8, and comprises an amount of garbage data 675-8.

Each of the CMUs 661-1 to 661-8 of page 650-3 includes a respective metadata field 663-1 to 663-8. The metadata fields 663-1 to 663-8 can indicate, for instance, a size (e.g., length) of the corresponding CMU, a starting location of a next CMU, and/or other information associated with the CMUs. In a number of embodiments, the CMUs (e.g., 661-1 to 661-8) may not include separate respective metadata fields, or the metadata fields (e.g., 663-1 to 663-4) may be located at positions other than at the beginning of a corresponding CMU.

Figure 7:
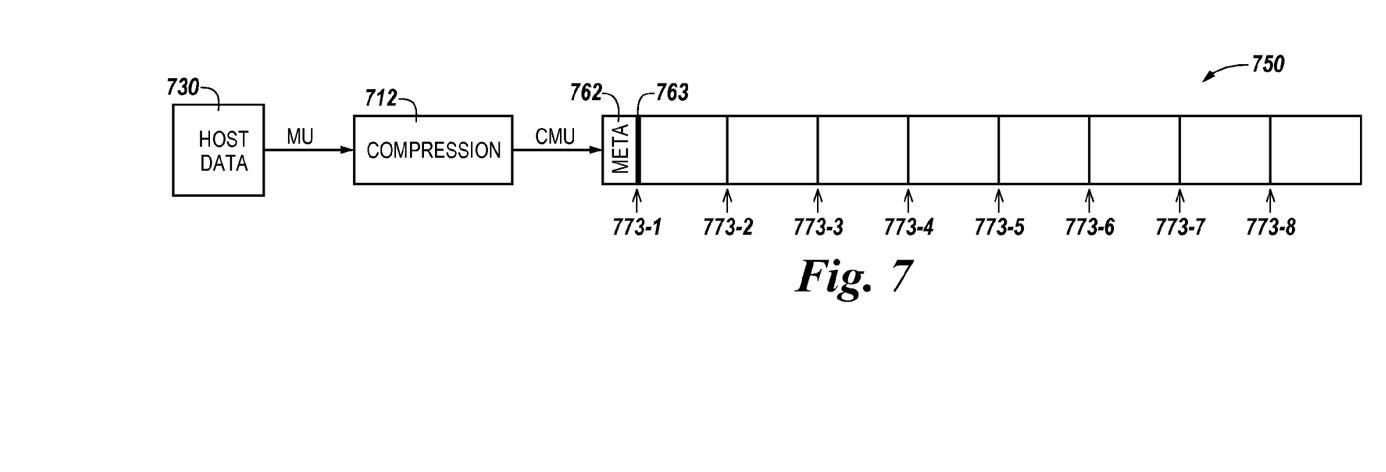
FIG. 7 illustrates a functional flow diagram corresponding to data compression and management in accordance with a number of embodiments of the present disclosure.

FIG. 7 illustrates a functional flow corresponding to data compression and management in accordance with a number of embodiments of the present disclosure. In FIG. 7, box 730 represents a number of data segments received from a host (e.g., a number of sectors of data received from a host such as host 102 shown in FIG. 1) and provided to a compression component 712 (e.g., in association with a write operation). The compression component 712 can be a compression component such as compression component 212 shown in FIG. 2 or compression/decompression component 112 shown in FIG. 1. In this example, an MU amount of data (e.g., 8 sectors) corresponding to N logical addresses (e.g., 8 logical addresses (LAs)) is provided to compression component 712. The N LAs can correspond to N 512B uncompressed host sectors, which can correspond to the MU amount of data.

The compression component 712 can compress the N sectors corresponding to the received MU (if one or more of the sectors are compressible), which forms a compressed managed unit (CMU). As such, in a number of embodiments, a CMU can comprise N sectors worth of user data (e.g., user data corresponding to N logical addresses). In a number of embodiments, the N uncompressed sectors of data corresponding to the MU received by the compression component 712 can be compressed individually (e.g., in accordance with respective compressibilities) and then combined to form a CMU. However, embodiments are not so limited. For instance, in a number of embodiments, a group of N uncompressed sectors corresponding to the MU received by the compression component 712 can be compressed together to form a CMU In a number of embodiments, and as illustrated in FIG. 7, CMUs formed by compression component 712 can be assigned to a page of data (e.g., page 750). As described above, a page of data can comprise a number of CMUs. In a number of embodiments, the CMUs can begin on one of a number of quantized boundaries (e.g., 773-1 to 773-8) corresponding to page 750. A space allocation between successive boundaries 773-1 to 773-8 can be sized to accommodate an uncompressed sector, for instance.

In this example, page 750 includes metadata 762, which can provide information such as a physical organization of CMUs within page 750, for instance. Page 750 also includes CMU metadata 763, which can provide information about a particular CMU assigned to page 750. As an example, the metadata 763 can indicate a size (e.g., length) of a particular CMU and/or logical address information corresponding to a particular CMU, among other information.

CONCLUSION

The present disclosure includes apparatuses and methods for data compression and management. A number of methods include receiving a number of data segments corresponding to a managed unit amount of data, determining a respective compressibility of each of the number of data segments, compressing each of the number of data segments in accordance with its respective determined compressibility, forming a compressed managed unit that includes compressed and/or uncompressed data segments corresponding to the number of data segments corresponding to the managed unit amount of data, and forming a page of data that comprises at least the compressed managed unit.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. A method for operating a memory, the method comprising:
    compressing a plurality of data segments in accordance with a respective plurality of determined compressibilities;
    forming a compressed managed unit that includes compressed data segments corresponding to the plurality of data segments;
        wherein forming the compressed managed unit includes determining a compression value for the compressed managed unit, the compression value indicating an amount of space allotted to each of the compressed data segments; and
        wherein determining the compression value includes:
            determining a compression level for each respective data segment of the plurality of data segments; and
            determining a least compressible of the plurality of data segments;
    allotting a same amount of space within the compressed managed unit to each of the compressed data segments such that the amount of space allotted to each of the compressed data segments is independent of a size of the respective compressed data segment, wherein the same amount of space allotted to each of the compressed data segments is an uppermost compressed segment size corresponding to the determined compression level of the least compressible of the plurality of data segments.

2. The method of claim 1, further comprising forming a page of data that comprises at least the compressed managed unit.

3. The method of claim 2, wherein forming the page further comprises forming a page that includes at least two compressed managed units having different determined compression values.

4. The method of claim 3, wherein the page of data includes metadata indicating a particular location of the at least two compressed managed units within the page.

5. The method of claim 1, further comprising providing a mapping indicating:
    a physical address of the page of data; and
    a location within the page of data of a target compressed managed unit corresponding to a target logical address.

6. The method of claim 1, wherein forming a compressed managed unit further comprises forming a compressed managed unit that includes data segments having different determined compression levels.

7. The method of claim 1, further comprising decompressing a compressed data segment corresponding to a target logical address and providing the decompressed data segment to a host in association with a host read request.

8. The method of claim 1, further comprising:
    forming a page of data that comprises at least the compressed managed unit;
    reading the page of data from the memory;
    decompressing compressed data segments corresponding to the plurality of compressed managed units; and
    providing the decompressed data segments to a host.

9. The method of claim 1, further comprising:
    performing a compression operation on an additional plurality (N) of uncompressed data segments;
    forming an additional compressed managed unit that includes compressed data segments corresponding to the N uncompressed data segments; and
    forming a page of data such that it comprises at least the compressed managed unit and the additional compressed managed unit, wherein the additional compressed managed unit begins on one of the number of quantized boundaries of the page.

10. An apparatus, comprising:
    a memory configured to store a plurality of compressed managed units within a page of data, wherein each compressed managed unit of the plurality of compressed managed units has a respective compression value based, at least partially, on compression levels of a plurality of compressed data segments corresponding thereto;
    wherein, for each compressed managed unit of the plurality of compressed managed units:
        the corresponding compression value indicates an amount of space allotted to each compressed data segment of the plurality of compressed data segments; and
        the corresponding compression value is based on:
            determined compression levels of the plurality of compressed data segments, the compression levels indicating respective compressibilities of the plurality of compressed data segments; and
            a least compressible of the plurality of compressed data segments of the compressed managed unit; and wherein to each of the plurality of compressed data segments, a same amount of space within the compressed managed unit is allotted such that the amount of space allotted to each of the compressed data segments is independent of a size of the respective compressed data segment, wherein the same amount of space allotted to each of the compressed data segments is an uppermost compressed segment size corresponding to the determined compression level of the least compressible of the plurality of data segments.

11. The apparatus of claim 10, wherein each of the plurality of compressed data segments corresponding to a respective compressed managed unit has a respective compression header corresponding thereto.

12. The apparatus of claim 10, further comprising a controller coupled to the memory, the controller including a translation component providing a mapping indicating a physical address of the page of data and a location within the page of data of a target compressed managed unit corresponding to a target logical address.

13. The apparatus of claim 2, wherein the controller is configured to control locating a particular compressed data segment corresponding to the target logical address by traversing the target compressed managed unit based, at least partially, on the compression value corresponding to the target compressed managed unit.

14. The apparatus of claim 2, wherein the mapping further comprises an index indicating a starting position within the page of data of the target compressed managed unit.

15. The apparatus of claim 10, wherein the page of data includes a separate metadata field for each of the respective plurality of compressed managed units, the separate metadata field indicating a size of the respective plurality of compressed managed units.

16. An appparatus, comprising:
 a memory; and
 a compressed managed unit stored in the memory, the compressed managed unit comprising:
  a plurality of compressed data segments corresponding to a respective plurality of (N) uncompressed data segments;
 wherein the compressed managed unit has a compression value corresponding thereto, the compression value indicating an amount of space allotted to each of the plurality of compressed data segments;
 wherein the compression value is determined based on:
  a determined compression level for each data segment of the N uncompressed data segments, the compression level indicating the respective compressibilities of the data segments; and
  a least compressible of the N uncompressed data segments of the compressed managed unit; and
 wherein a same amount of space within the compressed managed unit is allotted to each of the plurality of compressed data segments such that the amount of space allotted to each of the compressed data segments is independent of a size of the respective compressed data segment, wherein the same amount of space allotted to each of the compressed data segments is an uppermost compressed segment size corresponding to the compression level of the least compressible of the plurality of data segments.

17. The apparatus of claim 16, wherein the compressed managed unit begins on one of a plurality of quantized boundaries of a page of data, and wherein a space allocation between each of the successive quantized boundaries is sized to accommodate an uncompressed data segment.

18. The apparatus of claim 17, wherein the plurality of quantized boundaries of the page comprises N quantized boundaries, and wherein the compressed managed unit spans at least two of the N quantized boundaries.

19. The apparatus of claim 18, wherein the first compressed managed unit spans from the page of data to an additional page of data.

20. The apparatus of claim 16, wherein the N uncompressed data segments are host sectors, and wherein N is equal to 8.

* * * * *